(12) United States Patent
Zhang

(10) Patent No.: US 6,211,536 B1
(45) Date of Patent: *Apr. 3, 2001

(54) SEMICONDUCTOR DEVICE HAVING IMPROVED CRYSTAL ORIENTATION

(75) Inventor: Hongyong Zhang, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/333,920

(22) Filed: Jun. 16, 1999

Related U.S. Application Data

(62) Division of application No. 08/802,408, filed on Feb. 18, 1997, now Pat. No. 5,942,768, which is a continuation of application No. 08/539,558, filed on Oct. 5, 1995, now abandoned.

(30) Foreign Application Priority Data

Oct. 7, 1994 (JP) .................................................. 6-270562

(51) Int. Cl.$^7$ ...................................................... H01L 29/04
(52) U.S. Cl. ............................ 257/72; 257/66; 257/627; 257/628
(58) Field of Search .................................. 257/66, 72, 64, 257/59, 65, 75, 70, 607, 627, 628

(56) References Cited

U.S. PATENT DOCUMENTS

| 4,766,477 | 8/1988 | Nakagawa et al. ..................... 257/59 |
| 5,147,826 | 9/1992 | Liu et al. . | |

(List continued on next page.)

FOREIGN PATENT DOCUMENTS

| 58-68923 | 4/1983 | (JP) . |
| 59-28327 | 2/1984 | (JP) . |

(List continued on next page.)

OTHER PUBLICATIONS

A.V. Dvurechenskii et al., "Transport Phenomena in Amorphous Silicon Doped by Ion Implantation of 3d Metals", kademikian Lavrentev Prospekt 13, 630090 Novosibirsk 90, USSR, pp. 635–640, 1990.

T. Hempel et al., "Needle–Like Crystallization of Ni Doped Amorphous Silicon Thin Films", Solid State Communications, vol. 85, No. 11, pp. 921–924, 1993.

(List continued on next page.)

*Primary Examiner*—Minh Loan Tran
(74) *Attorney, Agent, or Firm*—Eric J. Robinson; Nixon Peabody LLP

(57) ABSTRACT

Thin-film transistors (TFTs) of peripheral logic circuits and TFTs of an active matrix circuit (pixel circuit) are formed on a single substrate by using a crystalline silicon film. The crystalline silicon film is obtained by introducing a catalyst element, such as nickel, for accelerating crystallization into an amorphous silicon film and heating it. In doing so, the catalyst element is introduced into regions for the peripheral logic circuits in a nonselective manner, and is selectively introduced into regions for the active matrix circuit. As a result, vertical crystal growth and lateral crystal growth are effected in the former regions and the latter regions, respectively. Particularly in the latter regions, the off-current and its variation can be reduced. The vertical growth and the lateral growth have a difference in the degree of crystal orientation. In general, the vertical growth does not provide so high of a degree of crystal orientation in which orientation in the (111) plane with respect to the substrate surface is dominate to a small extent. In contrast, remarkable orientation is found in the lateral growth. For example, the ratio of a reflection intensity of the (111) plane to the sum of reflection intensities of the (111), (220) and (311) planes can amount to more than 80 or 90%.

30 Claims, 5 Drawing Sheets

U.S. PATENT DOCUMENTS

| | | | |
|---|---|---|---|
| 5,153,702 | 10/1992 | Aoyama et al. | 257/59 |
| 5,275,851 | 1/1994 | Fonash et al. . | |
| 5,278,093 | 1/1994 | Yonehara . | |
| 5,463,254 | 10/1995 | Iyer et al. | 257/757 |
| 5,481,121 | 1/1996 | Zhang et al. | 257/72 |
| 5,488,000 | 1/1996 | Zhang et al. | 148/DIG. 1 |
| 5,534,716 | 7/1996 | Takemura | 257/59 |
| 5,543,352 | 8/1996 | Ohtani et al. . | |
| 5,585,291 | 12/1996 | Ohtani et al. . | |
| 5,600,169 | 2/1997 | Burgener et al. | 257/352 |
| 5,604,360 | 2/1997 | Zhang et al. | 257/72 |
| 5,616,935 | 4/1997 | Koyama et al. | 257/69 |
| 5,643,826 | 7/1997 | Ohtani et al. | 438/97 |
| 5,654,203 | 8/1997 | Ohtani et al. | 438/97 |
| 5,663,077 | 9/1997 | Adachi et al. | 438/151 |
| 5,942,768 * | 8/1999 | Zhang | 257/72 |

FOREIGN PATENT DOCUMENTS

| | | |
|---|---|---|
| 60-136304 | 7/1985 | (JP) . |
| 61-63017 | 4/1986 | (JP) . |
| 1-132116 | 5/1989 | (JP) . |
| 2-32527 | 2/1990 | (JP) . |
| 2-143415 | 6/1990 | (JP) . |
| 4-180219 | 6/1992 | (JP) . |
| 5-82442 | 4/1993 | (JP) . |
| 58-206121 | 12/1993 | (JP) . |

OTHER PUBLICATIONS

C. Hayzelden et al., "In Situ Transmission Electron Microscopy Studies of Silicide–Mediated Crystallization of Amorphous Silicon" (3 pages), *J. Appl. Phys.* (993) 8279, 73, 12, 1993.

Bonnel et al., Polycrystalline Silicon Thin–Film Transistors with Two–Step Annealing Process, IEEE Electron Device Letters, vol. 14, No. 12, Dec. 1993, pp. 551–553.

Batstone et al., "In situ TEM Studies of the Crystallization of Amorphous Silicon: The Role of Silicides", Microscopy of Semiconducting Materials 1993, pp. 165–172, 1993.

Hayzelden et al., "Silicide Formation and Silicide–Mediated Crystallization of Nickel–Implanted Amorphous Silicon Thin Films", J. Appl. Phys., vol. 73, No. 12, Jun. 15, 1993.

Schoenfeld et al., "Crystallization of Amorphous Silicon by $NiSi_2$ Precipitates", Thin Solid Films 261, 1995, pp. 236–240.

Crystallized Si Films By Low–Temperature Rapid Thermal Annealing of Amorphous Silicon, R. Kakkad, J. Smith., W.S. Lau, S.J. Fonash, J. Appl. Phys. 65 (5), Mar. 1, 1989, 1989 American Institute of Physics, p. 2069–2072.

"Polycrystalline Silicon Thin Film Transistors on Corning 7059 Glass Substrates Using Short Time, Low Temperature Processing" G. Liu et al., Appl. Phys. Lett. 62 (20), May 17, 1993, 1993 American Institute of Physics, p. 2554–2556.

"Low Temperature Selective Crystallization of Amorphous Silicon", R. Kakkad, G. Liu, S. Fonash, Journal of Non-Crystalline Solids, vol. 115, (1989), p. 66–68.

"Selective Area Crystallization of Amorphous Silicon Films by Low–Temperature Rapid Thermal Annealing", Gang Liu et al., Appl. Phys. Lett. 55 (7), Aug. 14, 1989, 1989 American Institute of Physics, p. 660–662.

English Translation of Japanese Patent Office Communication about Claim Rejection of Corresponding Japanese Patent Application.

* cited by examiner

SEMICONDUCTOR DEVICE HAVING IMPROVED CRYSTAL ORIENTATION

This application is a Divisional of application Ser. No. 08/802,408 now U.S. Pat. No. 5,942,768, filed Feb. 18, 1997; which itself is a Continuation of Ser. No. 08/539,558, filed Oct. 5, 1995 now abandoned.

BACKGROUND OF THE INVENTION

1. Field of the Invention

The present invention relates to a semiconductor circuit having a plurality of thin-film transistors (TFTs) and a manufacturing method thereof. The semiconductor circuit that is manufactured according to the invention is formed on either an insulating substrate such as glass or a semiconductor substrate such as single crystal silicon. In particular, the present invention is effectively applied to a semiconductor circuit, such as a monolithic active matrix circuit (used in, for instance, a liquid crystal display), having a matrix circuit that is required to have a small off-current with a small variation and peripheral circuits for driving it which are required to operate at high speed and to have a small-variation on-current.

2. Description of the Prior Art

In recent years, various studies have been made of insulated-gate semiconductor devices having a thin-film active layer (also called an active region) on an insulating substrate. In particular, thin-film insulated gate transistors, i.e., thin-film transistors (TFTs), have been studied eagerly. The TFTs, which are formed on a transparent, insulating substrate, are intended to be used for controlling individual pixels in a display device having a matrix structure such as a liquid crystal display. The TFTs are classified into an amorphous silicon TFT, a crystalline silicon TFT, etc. depending on a semiconductor material used and its crystal state.

In general, having a small field-effect mobility, amorphous semiconductors cannot be used for a TFT that is required to operate at high speed. Therefore, to manufacture circuits having higher performance, crystalline silicon TFTs have been studied and developed recently. As methods for obtaining a crystalline silicon film, there are known a method in which amorphous silicon is thermally annealed for a long time at a temperature of about 600° C. or higher, and an optical annealing method in which amorphous silicon is illuminated with strong light such as laser light.

Having a larger field-effect mobility than amorphous semiconductors, crystalline semiconductors can operate at higher speed. Since crystalline silicon can provide not only an NMOS TFT but also a PMOS TFT in a similar manner, a CMOS circuit can be formed by using crystalline silicon. For example, among active matrix type liquid crystal display devices, there is known one having a monolithic structure (i.e., a monolithic active matrix circuit) in which peripheral circuits (drivers, etc.) are also constituted of CMOS crystalline TFTs.

FIG. 1 is a block diagram showing a monolithic active matrix that is used in a general liquid crystal display. A source driver (column driver) and a gate driver (row driver) are provided as peripheral driver circuits. A large number of pixel circuits each constituted of a switching transistor and a capacitor are formed in an active matrix circuit area (pixel area). The pixel transistors of the matrix circuit are connected to each of the peripheral driver circuits via source lines or gate lines having the same number of columns or rows. TFTs used in the peripheral circuits, particularly peripheral logic circuits such as a shift register, are required to operate at high speed. Therefore, those TFTs are required to allow passage of a large current with a small variation in a selected state (on-current).

On the other hand, to assure a long-term holding of charge in the capacitor, TFTs used in the pixel circuit are required to have a sufficiently small leak current (off-current) with a small variation in a non-selected state, i.e., while a reverse-bias voltage is applied to the gate electrode. Specifically, the off-current should be smaller than 1 pA, and the variation should be less than 10%. On the other hand, the on-current need not be so large.

Although the above characteristics are physically contradictory, it is required that TFTs having such characteristics be formed on the same substrate at the same time, which means that all the TFTs should have a large on-current and a small off-current both with a small variation. It is easily understood that it is technically very difficult to satisfy such requirements.

For example, it is known that crystallizing an amorphous silicon film by optical annealing such as laser annealing is effective for obtaining a TFT having a large on-current (i.e., a large field-effect mobility). However, it is empirically known that it is impossible to attain both of a large field-effect mobility and a small off-current variation at the same time.

Also known is a method of crystallizing an amorphous silicon film by thermal annealing. Although this method can reduce an offcurrent variation, it cannot provide a large field-effect mobility. The present invention is to solve such a difficult problem.

SUMMARY OF THE INVENTION

The present inventors have found that it becomes possible to proceed crystallization more easily and provide better crystallinity than in the conventional methods of using thermal annealing or optical annealing by bringing a very small amount of an element of Ni, Pt, Pd, Cu, Ag, Fe, or the like, or its compound substantially in close contact with the surface of an amorphous silicon film and then performing thermal annealing or optical annealing (laser annealing, rapid thermal annealing (RTA), or the like). For example, when the thermal annealing is employed, the crystallization time can be shortened and the crystallization temperature can be lowered from the conventional cases.

It has been confirmed that the above advantages are obtained because Ni, Pt, Pd, Cu, Ag, Fe, or the like serves as a catalyst element for accelerating crystallization of an amorphous silicon film. More specifically, the above catalyst elements form a crystalline silicide with amorphous silicon at a crystallization energy lower than that of amorphous silicon. Then, after the catalyst element in the silicide moves to the location of amorphous silicon ahead, silicon enters the site of the silicide which was occupied by the catalyst element, thus forming crystalline silicon. As the catalyst element moves through amorphous silicon, a crystallized region is formed.

Thus, it has been confirmed that the crystallization of an amorphous silicon film utilizing a catalyst element proceeds in two steps that respectively correspond to the following modes:

(1) The mode in which crystallization that occurs at a region where a catalyst element is introduced. Although it is not appropriate to strictly define the crystallization direction, it may be said that crystal growth proceeds perpendicularly to a substrate.

(2) The mode in which a crystal-grown region expands as catalyst element moves from the region where it was introduced to a region where it was not, so that crystal growth proceeds parallel with the substrate.

In particular, as for the crystal growth mode (2), growth of columnar crystals parallel to a substrate has been confirmed by observations using a TEM (transmission electron microscope). In the following description, the crystal growth mode (1) and a resulting crystallized region are called vertical growth and a vertical growth region, and the crystal growth mode (2) and a resulting crystallized region are called lateral growth and a lateral growth region.

For example, if a thin coating of a catalyst element, or its compound or the like is formed on an amorphous silicon film by a certain means so as to be substantially in close contact with the latter and then thermal annealing is performed, the coated portion is initially crystallized mainly by the vertical growth and thereafter a region surrounding that portion is crystallized by the horizontal growth.

The crystallinity can be improved by performing proper optical annealing after the above crystal growth by thermal annealing. The main effects of the optical annealing are to increase the field-effect mobility and reduce the threshold voltage.

The vertical growth and the lateral growth have a difference in the degree of crystal orientation. In general, the vertical growth does not provide so high a degree of crystal orientation in which orientation in the (111) plane with respect to the substrate surface is dominant to a small extent. In contrast, remarkable orientation is found in the lateral growth. For example, where a silicon film is coated with a silicon dioxide film or a silicon nitride film and then crystallized by thermal annealing, orientation in the (111) plane mainly occurs. Specifically; in an X-ray diffraction measurement, the ratio of a reflection intensity of the (111) plane to the sum of reflection intensities of the (111), (220) and (311) planes amounts to more than 80%.

The above tendency becomes more remarkable if optical annealing is performed after the crystallization by thermal annealing; the above ratio increases to more than 90%.

Where a silicon film surface is crystallized by thermal annealing without coating it, orientation in the (220) plane is also enhanced, so that reflection intensities of both (111) and (220) planes become larger than 90%.

To effect the lateral growth, a catalyst element needs to be introduced selectively. This is usually done such that a hole for introduction is opened by photolithography in a coating of a material whose main component is silicon dioxide, silicon nitride or silicon oxynitride which coating is formed on an amorphous silicon film and then a thin film, a cluster, or the like of a catalyst element or its compound is formed by sputtering, CVD, spin coating, or some other method. The studies of the present inventors have revealed that if the hole diameter is less than 7 μm, a crystal growth defect occurs at a very high probability.

This is disadvantageous for use in a high-integration area such as peripheral logic circuits. In particular, such a manufacturing method is not applicable to the cases of design rules of 5 μm or less. On the other hand, the lateral growth does not cause any problem in an active matrix circuit where a sufficient distance is secured between adjacent TFTs.

However, it has become apparent that the lateral growth need not be employed for peripheral logic circuits. The investigations of the present inventors have revealed that while the lateral growth and the vertical growth do not cause a large difference in field-effect mobility, however, it can be increased by up to about two times by an optical annealing subsequent to thermal annealing. A typical field-effect mobility is 50 to 80 $cm^2$/Vs when only thermal annealing is performed. By additionally performing, for instance, laser annealing, an increased value of 100 to 200 $cm^2$/Vs was obtained. Either value is sufficiently large for TFTs in peripheral logic circuits.

It is not necessary to change the conditions of the above optical annealing for a vertical growth region and a lateral growth region. This is advantageous in terms of mass productivity because optical annealing for a single substrate can be performed under substantially the same conditions (except unintentional variations of conditions).

On the other hand, the vertical growth and the lateral growth cause large differences in the magnitude of the off-current and its variation. That is, while both of the off-current and its variation are small with the lateral growth, both of them tend to be large with the vertical growth.

The present invention is characterized in that by utilizing the above features of the vertical growth and the lateral growth, crystallization is effected by the lateral growth for TFTs of an active matrix circuit and by the vertical growth for TFTs of peripheral logic circuits. The peripheral logic circuits mean those included in a source driver and a gate driver. In such circuits as analog switches, either the vertical growth or the lateral growth may be employed.

The present invention is characterized in that a region crystallized by the lateral growth is used for TFTs of an active matrix circuit. In this case, there are several variations for the arrangement of TFTs as shown in FIG. 4. In FIG. 4, reference numeral 401 denotes a region where a catalyst element has been introduced, i.e., a region that has been crystallized by the vertical growth. A region 402 that has been crystallized by the lateral growth develops around the region 401.

As shown in FIG. 4, if the catalyst-added region 401 has a rectangular shape, the lateral growth region 402 assumes an elliptical shape. In one case (in the case of TFT1), a gate electrode 404 is formed generally parallel with the region 401 and crystal growth is effected in the direction from a drain 405 to a source 403, or the direction opposite thereto.

In another case (in the case of TFT2 in FIG. 4), a gate electrode 407 is formed generally perpendicularly to the region 401 and portions of a source 406 and a drain 408 are crystallized approximately at the same time. It has been confirmed that the above two cases do not cause much difference.

In an active matrix circuit, a catalyst element may be added linearly so as to be generally parallel with source lines or gate lines. FIGS. 5(A) and 5(B) show examples where catalyst-added regions 501 and 506 are parallel with gate lines 502 and 507, respectively. FIG. 5(A) shows a case corresponding to TFT2 in FIG. 4 in which case a catalyst is added generally perpendicularly to gate electrodes of TFTs 503 to 505. FIG. 5(B) shows a case corresponding to TFT1 in FIG. 4 in which case a catalyst element is added generally parallel with gate electrodes of TFTs 508 to 510. Catalyst-added regions may be provided generally parallel with source lines in a similar manner.

As described above, orientation in the (111) plane and the (220) plane is remarkable in a lateral growth region, and is not so remarkable in a vertical growth region. Therefore, in the present invention, a crystalline silicon semiconductor (lateral growth regions) for such elements as TFTs of an active matrix circuit, resistors and capacitors is given orientation in the (111) or (220) plane, and a crystalline silicon semiconductor for peripheral circuits is given a lower degree of orientation than that for the active matrix circuit.

If the thermal annealing for crystallization is performed at a temperature higher than the crystallization temperature of an amorphous silicon thin film, there can be obtained crystallinity equivalent to that obtained when laser annealing is also performed. The crystallization temperature of an amorphous silicon thin film is approximately in the range of 580 to 620° C. although it depends on the film deposition method and conditions. By performing a heat treatment at a temperature higher than this temperature (as high a temperature as possible is preferred as long as it is allowable), a crystalline silicon film having superior crystallinity can be obtained. It is preferred that the upper limit of the temperature of this heat treatment be set at about 1,100° C. To employ a heat treatment at such a high temperature, it is necessary to use a quartz substrate or a glass substrate capable of withstanding such a high temperature.

In the present invention, the vertical crystal growth utilizing a catalyst element is performed to obtain a crystalline silicon semiconductor for peripheral logic circuits having a high integration degree. As a result, TFTs having a large field-effect mobility can be obtained irrespective of the integration degree. On the other hand, the lateral crystal growth utilizing a catalyst element is performed for an active matrix circuit. As a result, TFTs having a small off-current with a small variation can be obtained. In particular, if the heat treatment for crystallization is performed at a temperature higher than the crystallization temperature of an amorphous silicon thin film, superior crystallinity can be obtained.

DESCRIPTION OF THE PREFERRED EMBODIMENTS

Embodiment 1

This embodiment relates to a process for manufacturing an active matrix circuit (pixel circuit) and peripheral logic circuits to be used in a liquid crystal display device on a single glass substrate at the same time. A crystalline silicon film for constituting TFTs of the active matrix circuit is obtained such that a catalyst element for accelerating crystallization is introduced into a region in the vicinity of a region to be crystallized and crystal growth is effected parallel with a substrate from the catalyst-added region by performing a heat treatment.

A crystalline silicon film for constituting TFTs of the peripheral logic circuits is obtained such that a catalyst element for accelerating crystallization is introduced into a region including a region where the TFT is to be formed and the entire area of the latter region is crystallized by performing a heat treatment.

FIGS. 2(A) to 2(F) are conceptual sectional views showing manufacturing steps of TFTs of a peripheral logic circuit and an active matrix circuit. In those figures, a region where a peripheral logic circuit is to be formed (peripheral circuit region) is shown on the left side and a region where pixels are to be formed (pixel region) is shown on the right side. Although the peripheral circuit region and the pixel region are shown adjacent to each other in those figures, actually they are not arranged in such a manner.

Figure 1:
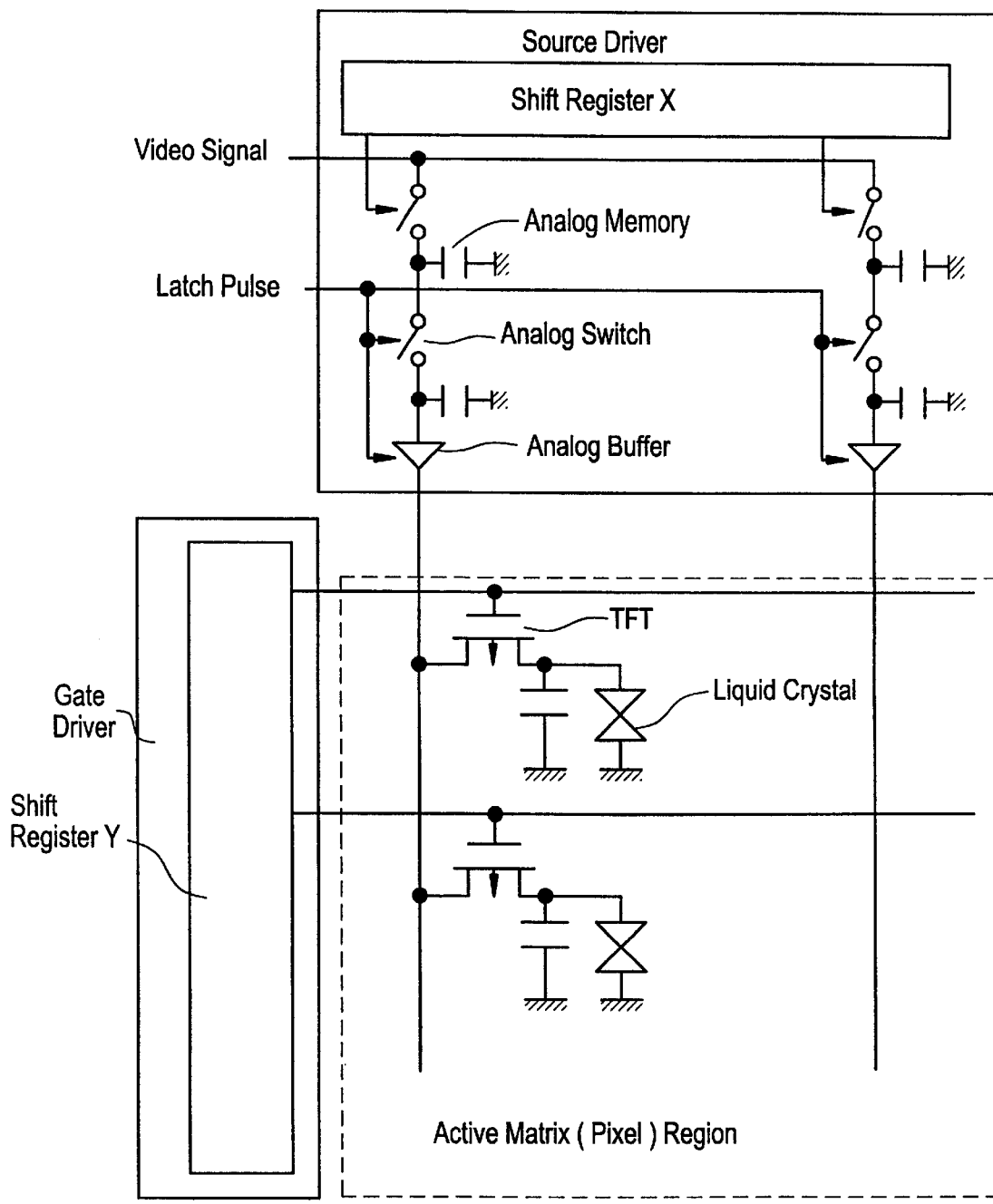
FIG. 1 shows a general configuration of a monolithic active matrix circuit.
Figure 2A:
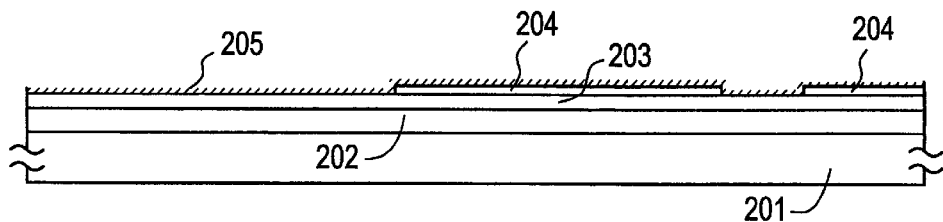
FIGS. 2(A) to 2(F) show manufacturing steps of TFTs according to Embodiment 1.
Figure 2B:
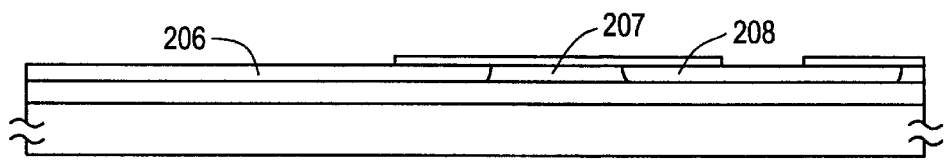
Figure 2C:
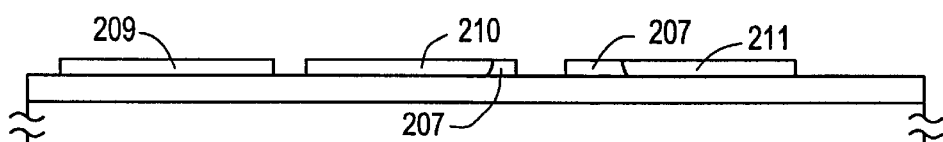
Figure 2D:
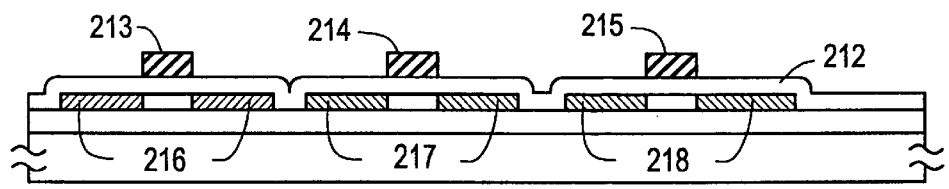
Figure 2E:
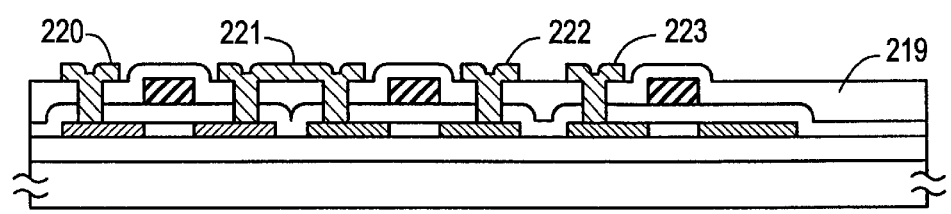
Figure 2F:
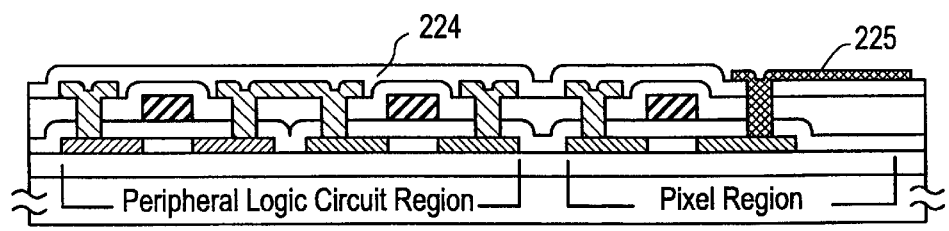
Figure 3A:
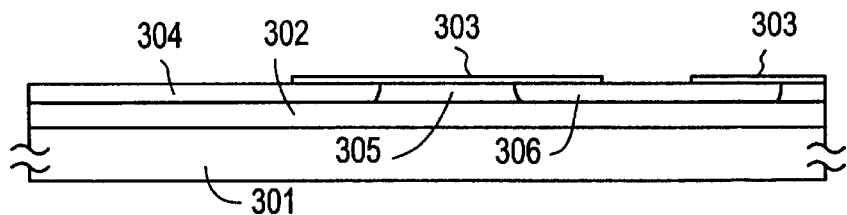
FIGS. 3(A) to 3(G) show manufacturing steps of TFTs according to Embodiment 2.
Figure 3B:
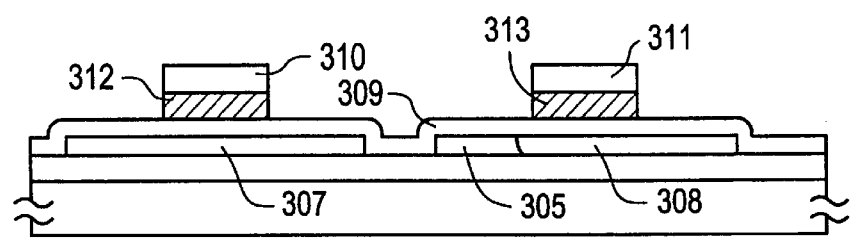
Figure 3C:
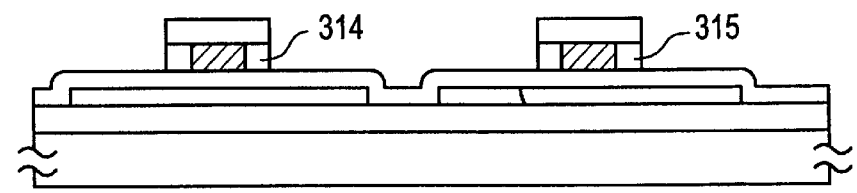
Figure 3D:
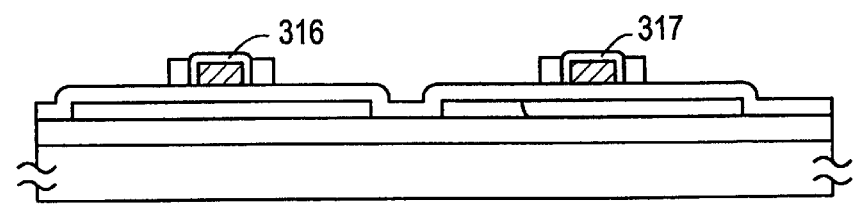
Figure 3E:
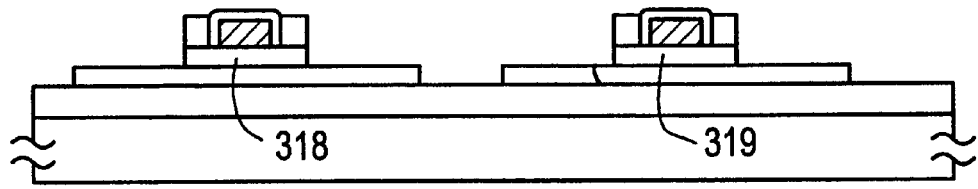
Figure 3F:
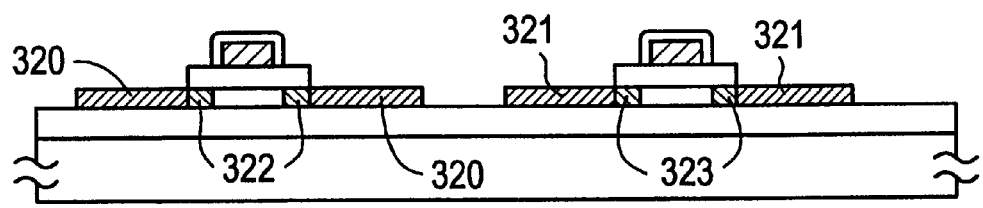
Figure 3G:
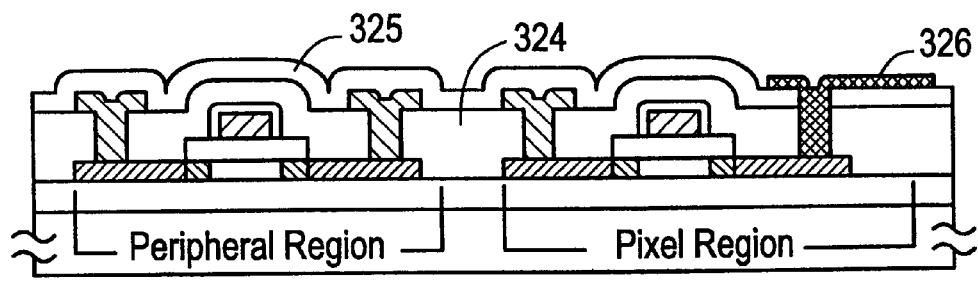
Figure 4:
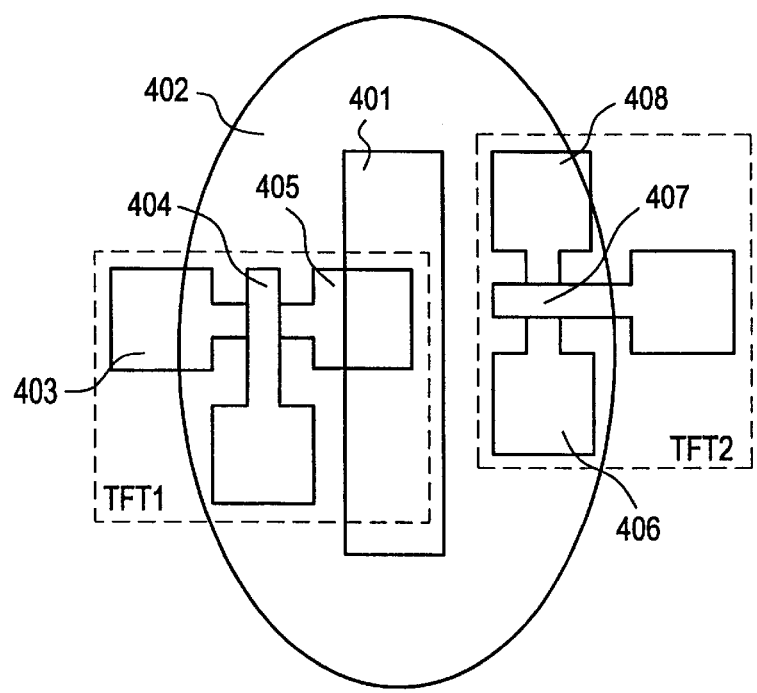
FIG. 4 shows an example of an arrangement of TFTs of an active matrix circuit and a lateral growth region.
Figure 5A:
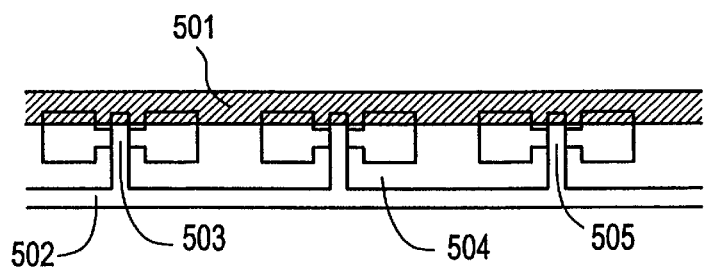
FIGS. 5(A) and 5(B) show examples of arrangements of TFTs of an active matrix circuit and catalyst-added regions.
Figure 5B:
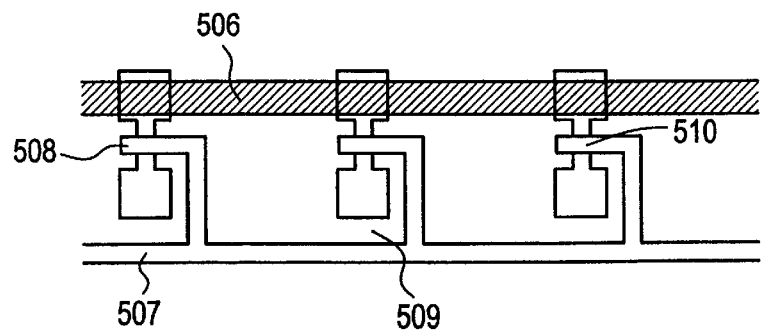

Although in those figures the TFT of the pixel region is shown such that a catalyst-added region and a gate electrode are arranged generally parallel with each other like TFT1 in FIG. 4, they may be arranged generally perpendicularly to each other like TFT2 in FIG. 4.

Manufacturing steps will be described below. First, a substrate 201 (Corning 7059 or some other borosilicate glasses) was cleaned, and a 2,000-Å-thick silicon oxide undercoat film 202 was formed by plasma CVD with TEOS (tetra ethoxy silane) and oxygen used as material gases.

Then, an amorphous silicon film 203 added with almost no conductivity-imparting impurities (phosphorus, boron, etc.) was deposited by plasma CVD or LPCVD at a thickness of 300 to 1,500 Å, for instance, 500 Å. Immediately thereafter, a silicon oxide film 204 was deposited by plasma CVD at a thickness of 100 to 2,000 Å, for instance, 200 Å. Portions of the amorphous silicon film 203 were exposed by selectively etching the silicon oxide film 204. After this step, the silicon oxide film 204 was completely removed in the peripheral circuit region that is shown on the left side of the figures, so that the surface of the amorphous silicon film 203 was exposed. The silicon oxide film 204 was selectively removed in the pixel region that is shown in the right side of the figures.

A very thin (several tens of angstroms) oxide film was formed on the surface of the amorphous silicon film 203 which were exposed in the above step, to prevent a solution from being repelled by the surface of the amorphous silicon film 203 in an ensuing solution applying step. This oxide film may be formed by thermal oxidation, illumination with ultraviolet light, or a treatment with a solution having a strong oxidizing ability such as an aqueous solution of hydrogen peroxide.

Then, a very thin film 205 of nickel acetate was formed on the surface of the amorphous silicon film 203 by applying thereto a nickel acetate solution containing nickel, which is a catalyst element for accelerating crystallization. Since this film is extremely thin, there is a possibility that it does not constitute a complete film. This step was performed by spin coating or spin drying. An appropriate range of the density (in terms of weight) of nickel in the acetate solution was 1 to 100 ppm. It was 10 ppm in this embodiment. (FIG. 2(A))

Thereafter, crystallization was effected by performing thermal annealing at 400 to 580° C., at 550° C. in this embodiment, for 4 hours. As a result, the almost entire amorphous silicon film 203 of the peripheral circuit region changed to a crystalline silicon film 206. In the pixel region, a crystalline silicon film 208 was obtained in a lateral growth region 208. An amorphous silicon film 207 was left in a region that is away from the nickel-added region. (FIG. 2(B))

After the silicon oxide film 204 was removed, to improve the crystallinity, KrF excimer laser light (wavelength: 248 nm) was applied to the entire surface by 2 to 20 shots per one location. The optimum energy density was 250 to 300 mJ/cm$^2$. However, since the optimum energy density depends on each silicon film, it was determined by preliminarily setting the conditions. The laser light illumination conditions were set in the same manner for the entire substrate surface. Although the energy density of the laser light illumination naturally has a temporal variation (fluctuation) and a microscopic observation will reveal variations of the number of shots of the laser light illumination and the accumulated illumination energy from one location to another, such variations are not intended ones. In this embodiment, the laser light illumination was performed under such conditions as limit the variation of the accumulated illumination energy within 10% in an arbitrary 1-cm$^2$ area.

Other excimer lasers such as a XeCl excimer laser (wavelength: 308 nm), an ArF excimer laser (193 nm) and a XeF excimer laser (353 nm), and other pulsed oscillation lasers were successfully used.

This step may be performed by a rapid thermal annealing (RTA).

A measurement by a secondary ion mass spectrometry (SIMS) showed that the nickel concentration in the resulting crystallized silicon film was typically $1 \times 10^{18}$ to $1 \times 10^{19}$ atoms/cm$^3$ in the vertical growth region 206 and $1 \times 10^{17}$ to $5 \times 10^{18}$ atoms/cm$^3$ in the lateral growth region 208.

After completion of the above steps, island-like active regions 209 to 211 were formed by dry-etching the silicon film. Although the active layers 210 and 211 partially include the amorphous silicon region 207, this causes no problem because the amorphous silicon region 207 does not constitutes the channel forming regions of the TFTs.

In the active layer 211, the region where nickel was directly introduced (i.e., the region that was not covered with the silicon oxide film 204 when nickel acetate was applied) was positioned so as not to overlap with the channel forming region of the TFT, for the following reason. It has been confirmed that in a region where nickel is directly introduced (i.e., a vertical growth region), nickel comes to exist at a higher concentration than in a lateral growth region. In TFTs of the pixel area which are required to have a small off-current with a small variation, a vertical growth region should not occupy at least part of the channel forming region. (FIG. 2(C))

Then, a 1,500-Å-thick silicon oxide film 212 to serve as a gate insulating film was formed by plasma CVD using monosilane (SiH$_4$) and dinitrogen monoxide (N$_2$O) as materials. In this embodiment, monosilane of 10 SCCM and dinitrogen monoxide of 100 SCCM were introduced into a reaction chamber, and the following conditions were employed. Substrate temperature: 430° C.; reaction pressure: 0.3 Torr; and applied power: 250 W (13.56 MHz). These conditions depend on the reaction apparatus used. The deposition rate of the silicon oxide film under the above conditions was about 1,000 Å/min, and its etching rate with a mixed solution (20° C.) of hydrofluoric acid, acetic acid, and ammonium fluoride (at a ratio of 1:50:50) was about 1,000 Å/min.

Subsequently, a polycrystalline silicon film (containing phosphorus at 1 to 2% to improve conductivity) was deposited by low-pressure CVD at a thickness of 2,000–8,000 Å, for instance, 4,000 Å, and etched to form gate electrodes 213 to 215.

Then, the active layers 209 to 211 were doped with impurities for imparting N-type and P-type conductivity by ion doping (also called plasma doping) in a self-alignment manner with the gate electrodes 213 to 215 used as a mask. In this embodiment, the TFT of the pixel region was of a P-channel type. That is, the active layers 210 and 211 were doped with a P-type impurity and the active layer 209 was doped with an N-type impurity. The known CMOS technology may be used for the doping of impurities of different conductivity types.

In this embodiment, phosphine (PH$_3$) was used as an N-type doping gas and diborane (B$_2$H$_6$) was used as a P-type doping gas. The acceleration voltage was 60 to 100 kV, for instance, 90 kV, for the former case and was 40 to 80 kV, for instance, 70 kV, for the latter case. The dose was $1 \times 10^{14}$ to $8 \times 10^{15}$ atoms/cm$^2$, for instance, $4 \times 10^{14}$ atoms/cm$^2$ for the N-type impurity and $1 \times 10^{15}$ atoms/cm$^2$ for the P-type impurity. In this manner, an N-type impurity region 216 and P-type impurity regions 217 and 218 were formed.

Then, to activate the doped impurities, thermal annealing was performed at 400 to 550° C. for 1–12 hours, for instance, at 450° C. for 2 hours. Since the catalyst element for accelerating crystallization of amorphous silicon was included in the active layers, the thermal annealing of such a low temperature and short period was sufficient for the activation and the resistivity of the impurity regions was reduced to about 1 kΩ/square or less, which feature is common to the invention. (FIG. 2(D))

Thereafter, an insulating film 219, which was composed of two layers of a 500-Å-thick silicon nitride film (having a passivation effect of preventing water and movable ions from being entering into the TFT) and a 4,000-Å-thick silicon oxide film, was formed as a first interlayer insulating film by plasma etching. After contact holes were formed in the insulating film 219, electrodes and wiring lines 220 to 223 of the TFTs were formed by using a metal material such as a multilayered film of titanium and aluminum (in this embodiment, a 500-Å-thick titanium film and a 4,000-Å-thick aluminum film). (FIG. 2(E))

Further, a 2,000-Å-thick silicon oxide film 224 was formed as a second interlayer insulating film by plasma CVD. After a contact hole was formed for the impurity region of the TFT of the pixel region for which impurity region a pixel electrode was to be formed, a pixel electrode 225 was formed by depositing a 800-Å-thick ITO (indium tin oxide) film by sputtering and etching it. (FIG. 2(F))

In the above manner, the pixel area and the peripheral circuit area of the active matrix liquid crystal display device were formed on the same glass substrate at the same time.

Embodiment 2

FIGS. 3(A) to 3(G) are sectional views showing manufacturing steps of this embodiment. The left side and the right side of the figures show a logic circuit region and a pixel region, respectively. Although in an actual circuit the logic circuit is a CMOS circuit including N-channel TFTs and P-channel TFTs, for simplicity the figures show only an N-channel TFT in the logic circuit region. An N-channel TFT was used also in the pixel region. In this embodiment, the TFTs have a structure in which lightly doped impurity regions are provided adjacent to the source and drain. The differences between the N-channel TFT and the P-channel TFT are only in the kind and concentrations of a doping impurity of the source/drain and the low-concentration impurity regions.

First, a 2,000-Å-thick silicon oxide undercoat film 302 was formed on a substrate (Corning 7059) 301 by sputtering. An intrinsic (I-type) amorphous silicon film was deposited by plasma CVD at a thickness of 300 to 1,000 Å, for instance, 500 Å. Further, a 200-Å-thick silicon oxide film 303 was formed by sputtering, and etched in the same manner as in Embodiment 1 to form regions for introduction of a catalyst element (nickel). A nickel acetate film was then formed by spin coating.

Then, the amorphous silicon film was crystallized by performing thermal annealing at 550° C. for 4 hours in a nitrogen atmosphere, to form a vertical growth region 304 and a lateral growth region 306. A region 305 was left amorphous.

Thereafter, the crystallinity was improved by laser light illumination. In this embodiment, a KrF excimer laser was used and its appropriate energy density range was from 250 to 350 mJ/cm$^2$. After the laser light illumination, thermal annealing was again performed at 550° C. for 1 hour to reduce strain due to the laser annealing. (FIG. 3(A))

By etching the silicon film thus crystallized, an island-like active layer 307 (for the logical circuit TFT) and an island-like active layer 308 (for the pixel TFT) were formed.

After a 1,200-Å-thick silicon oxide film 309 was deposited by thermal CVD with monosilane (SiH$_4$) and oxygen (O$_2$) used as materials, thermal annealing was performed at 1 atm and 400 to 500° C. for 1 to 12 hours in a dinitrogen monoxide (N$_2$O) atmosphere.

Subsequently, an aluminum film was deposited by sputtering at a thickness of from 2,000 to 8,000 Å, for instance, 4,000 Å. To improve adhesiveness with a photoresist, a very thin (50 to 200 Å) anodic oxide film (not shown) was formed on the aluminum film. After photoresist masks 310 and 311 were formed by a known photographic method with application of a photoresist, the aluminum film was etched to form gate electrodes 312 and 313. To prevent abnormal crystal growth (hillock) in heat treatment or the subsequent anodic oxidation step, aluminum was mixed with scandium (Sc) or yttrium (Y) at 0.1 to 0.5 wt %. The photoresist mask that was used as the mask of the above etching was left as it was on the gate electrodes 312 and 313. (FIG. 3(B))

Then, anodic oxide films 314 and 315 were formed at a thickness of 1 to 5 μm, for instance, 2 μm, by anodic oxidation in which a current was caused to flow through the above structure in an electrolyte. The anodic oxidation may be performed by using an acid aqueous solution of citric acid of 3 to 20%, nitric acid, phosphoric acid, chromic acid, sulfuric acid, or the like and applying a constant voltage of 10 to 30 V to the gate electrodes 312 and 313. In this embodiment, the anodic oxidation was performed by using an oxalic acid solution (pH=0.9 to 1.0; 30° C.) and applying 10 V. The thickness of the anodic oxide films 314 and 315 were controlled by the anodic oxidation time.

The thus-obtained anodic oxide films 314 and 315 were porous ones. In the above anodic oxidation step, the thin anodic oxide film between the gate electrodes 312 and 313 and the photoresist masks 310 and 311 suppressed current leakage from the photoresist, and anodic oxidation was allowed to proceed on the side faces of the gate electrodes 312 and 313. (FIG. 3(C))

After the photoresist masks 310 and 311 were removed, a voltage was applied to the gate electrodes 313 and 314 in an electrolyte. This time, an ethylene glycol ammonia solution (pH=6.9 to 7.1) containing at least one of tartaric acid of 3–10%, boric acid and nitric acid. Better oxide films were obtained when the temperature of the solution was about 10° C., i.e., lower than the room temperature. Thus, anodic oxide films 316 and 317 were formed on the top and side faces of the gate electrodes 312 and 313. The thickness of the anodic oxide films 316 and 317 was approximately proportional to the application voltage, and 2,000-Å-thick anodic oxide films were formed with an application voltage of 150 V. Being dense and hard, the anodic oxide films 316 and 317 were effective in protecting the gate electrodes 312 and 313 in subsequent heating steps. (FIG. 3(D))

Subsequently, the silicon oxide film 309 was etched by dry etching. Since the porous anodic oxide films 314 and 315 were not etched in this etching step, silicon oxide films 318 and 319 under those films 314 and 315 were also not etched and were left as they were. (FIG. 3(E))

Then, the anodic oxide films 314 and 315 were etched with a mixed acid of phosphoric acid, acetic acid, and nitric acid. In this etching step, only the anodic oxide films 314 and 315 were etched at an etching rate of about 600 Å/min. The gate insulating films 318 and 319 under those films 314 and 315 were left as they were.

Thereafter, the active layers 307 and 308 were doped with an impurity (phosphorus) by ion doping with the gate electrodes 312 and 313 and the gate insulating films 318 and 319 used as a mask. Two-step doping was performed by using phosphine (PH$_3$) as a doping gas. In the first step, the acceleration voltage and the dose were set at 80 kV and 5×10$^{12}$ atoms/cm$^2$. In this doping step, ions penetrated through the gate insulating films 318 and 319 and reached the regions thereunder. Because of a low dose, lightly doped impurity regions 322 and 323 were formed.

In the second doping step, the acceleration voltage and the dose were set at 30 kV and 5×10$^{14}$ atoms/cm$^2$. In this doping step, ions could not penetrate through the gate insulating films 318 and 319, and were mainly implanted into the silicon-exposed regions of the active layers. Because of a high dose, heavily doped impurity regions (source and drain) 320 and 321 were formed. In forming actual circuits, doping of a P-type impurity was also conducted.

After the doping, impurities were activated by laser annealing. In this embodiment, a KrF excimer laser (wavelength: 248 nm) was used and its appropriate energy density range was 200 to 300 mJ/cm$^2$. Instead of the laser annealing, thermal annealing as in Embodiment 1 was successfully used for the impurity activation. Further, a successful result was obtained when thermal annealing was performed after the laser annealing. (FIG. 3(F))

Subsequently, an interlayer insulating film 324 composed two layers of a 500-Å-thick silicon nitride film and a 4,000-Å-thick silicon oxide film was formed by plasma CVD. After contact holes were formed in the insulating film 324, source electrodes and wiring lines were formed by using a multilayered film of titanium and aluminum. (FIG. 3(G))

Then, a 2,000-Å-thick silicon oxide film (second interlayer insulating film) 325 was formed by plasma CVD. After a contact hole was formed in the pixel TFT, a pixel electrode 326 made of a transparent conductive film was connected to the TFT through the hole. With the above steps, a monolithic active matrix circuit was completed. (FIG. 3(G))

Embodiment 3

In this embodiment, a Corning 1737 glass substrate is used in the configuration of Embodiment 1 or 2. Since the Corning 1737 glass substrate has a strain point of 667° C., it can withstand a heat treatment that is conducted at a temperature lower than that point.

According to experiments, the crystallization temperature of amorphous silicon films deposited by plasma CVD is about 590° C. This embodiment is characterized in that a crystalline silicon film is obtained by a heat treatment of 650° C. and 4 hours.

Where the heat treatment is performed at a temperature higher than the crystallization temperature of an amorphous silicon film, a crystalline silicon film having superior crystallinity can be obtained with action of an element of nickel introduced.

As described above, according to the present invention, peripheral logic circuits and an active matrix circuit can be constructed effectively. In particular, by utilizing a metal element that accelerates crystallization of silicon, superior crystallinity can be obtained, to thereby enable construction of peripheral logic circuits and an active matrix circuit having necessary characteristics.

What is claimed is:

1. A semiconductor device comprising:
a plurality of thin film transistors provided on an insulating surface, each of said thin film transistors comprising a semiconductor film having a source region, a drain region and a pair of lightly doped impurity regions,
wherein said semiconductor film comprises (111), (220) and (311) planes, and ratio of a reflection intensity of the (111) plane to sum of reflection intensities of the (111), (220) and (311) planes amounts to larger than 90%.

2. A semiconductor device according to claim 1 wherein said semiconductor film has a thickness of 300 to 1500 angstrom and comprises silicon.

3. A semiconductor device according to claim 1 wherein said reflection intensities of the (111), (220) and (311) planes is measured by an X-ray diffraction.

4. A semiconductor device according to claim 1 further comprising an interlayer insulating film comprising a silicon nitride film.

5. A semiconductor device according to claim 1 wherein said semiconductor film has a crystal growth direction parallel to said insulating surface.

6. A semiconductor device comprising:
a plurality of thin film transistors provided on an insulating surface, each of said thin film transistors comprising a semiconductor film having at least a source region, a drain region and a pair of lightly doped impurity regions,
wherein said semiconductor film comprises (111), (220) and (311) planes, and ratio of a reflection intensity of the (111) plane to sum of reflection intensities of the (111), (220) and (311) planes amounts to larger than 80% in one region of said semiconductor film and does not amount to larger than 80% in another region of said semiconductor film.

7. A semiconductor device according to claim 6 wherein said semiconductor film has a thickness of 300 to 1500 angstrom and comprises silicon.

8. A semiconductor device according to claim 6 wherein said reflection intensities of the (111), (220) and (311) planes is measured by an X-ray diffraction.

9. A semiconductor device according to claim 6 further comprising an interlayer insulating film comprising a silicon nitride film.

10. A semiconductor device according to claim 6 wherein said one region of said semiconductor film has a crystal growth direction parallel to said insulating surface.

11. An active matrix electro-optical device comprising:
a plurality of thin film transistors arranged in a direction over a substrate for constituting at least a part of an active matrix region, each of said thin film transistors comprising:
a semiconductor film comprising crystalline silicon having at least a source region, a drain region, a channel region and a pair of lightly doped impurity regions; and
a gate electrode adjacent to said channel region with an insulating film interposed between said gate electrode and said channel region,
wherein said semiconductor film comprises (111), (220) and (311) planes, and ratio of a reflection intensity of the (111) plane to sum of reflection intensities of the (111), (220) and (311) planes amounts to larger than 90%.

12. An active matrix electro-optical device according to claim 11 wherein said semiconductor film has a thickness of 300 to 1500 angstrom and comprises silicon.

13. An active matrix electro-optical device according to claim 1 wherein said reflection intensities of the (111), (220) and (311) planes is measured by an X-ray diffraction.

14. An active matrix electro-optical device according to claim 11 further comprising an interlayer insulating film comprising a silicon nitride film.

15. An active matrix electro-optical device according to claim 11 wherein said semiconductor film has a crystal growth direction parallel to a surface of said substrate.

16. An active matrix electro-optical device comprising:
a gate line extending in a direction over a substrate;
a plurality of thin film transistors arranged in said direction over said substrate for constituting at least a part of an active matrix region, each of said thin film transistors comprising:
a semiconductor film comprising crystalline silicon having at least a source region, a drain region, a channel region and a pair of lightly doped impurity regions; and
a gate electrode adjacent to said channel region with an insulating film interposed between said gate electrode and said channel region, said gate electrode connected with said gate line,
wherein said semiconductor film comprises (111), (220) and (311) planes, and ratio of a reflection intensity of the (111) plane to sum of reflection intensities of the (111), (220) and (311) planes amounts to larger than 90%.

17. An active matrix electro-optical device according to claim 16 wherein said semiconductor film has a thickness of 300 to 1500 angstrom.

18. An active matrix electro-optical device according to claim 16 wherein said reflection intensities of the (111), (220) and (311) planes is measured by an X-ray diffraction.

19. An active matrix electro-optical device according to claim 16 further comprising an interlayer insulating film comprising a silicon nitride film.

20. An active matrix electro-optical device according to claim 16 wherein said semiconductor film has a crystal growth direction parallel to a surface of said substrate.

21. An active matrix electro-optical device comprising:
a source line extending in a direction over a substrate;
a plurality of thin film transistors arranged in said direction over said substrate for constituting at least a part of an active matrix region, each of said thin film transistors comprising:
a semiconductor film comprising crystalline silicon having at least a source region, a drain region, a channel region and a pair of lightly doped impurity regions wherein one of the source region and the drain region is connected to said source line; and
a gate electrode adjacent to said channel region with an insulating film interposed between said gate electrode and said channel region,
wherein said semiconductor film comprises (111), (220) and (311) planes, and ratio of a reflection intensity of the (111) plane to sum of reflection intensities of the (111), (220) and (311) planes amounts to larger than 90%.

22. An active matrix electro-optical device according to claim 21 wherein said semiconductor film has a thickness of 300 to 1500 angstrom.

23. An active matrix electro-optical device according to claim 21 wherein said reflection intensities of the (111), (220) and (311) planes is measured by an X-ray diffraction.

24. An active matrix electro-optical device according to claim 21 further comprising an interlayer insulating film comprising a silicon nitride film.

25. An active matrix electro-optical device according to claim 21 wherein said semiconductor film has a crystal growth direction parallel to a surface of said insulating surface.

26. A semiconductor device comprising:
 a plurality of thin film transistors provided on an insulating surface, each of said thin film transistors comprising a semiconductor film having at least a source region, a drain region and a pair of lightly doped impurity regions,
 wherein said semiconductor film comprises a (220) plane and a ratio of a reflection intensity of the (220) plane to sum of reflection intensities of (111), (220) and (311) planes amounts to larger than 90%.

27. A semiconductor device according to claim 26 wherein said semiconductor film has a thickness of 300 to 1500 angstrom and comprises silicon.

28. A semiconductor device according to claim 26 wherein said reflection intensities of the (111), (220) and (311) planes is measured by an X-ray diffraction.

29. A semiconductor device according to claim 26 further comprising an interlayer insulating film comprising a silicon nitride film.

30. A semiconductor device according to claim 26 wherein said semiconductor film has a crystal growth direction parallel to said insulating surface.

* * * * *